United States Patent
Araki et al.

[11] Patent Number: 5,959,888
[45] Date of Patent: Sep. 28, 1999

[54] NON-VOLATILE SEMICONDUCTOR MEMORY DEVICE AND METHOD OF MANUFACTURING NON-VOLATILE SEMICONDUCTOR MEMORY DEVICE

[75] Inventors: Hitoshi Araki, Yokkaichi; Kazuo Hatakeyama, Tokyo-to, both of Japan

[73] Assignee: Kabushiki Kaisha Toshiba, Kawasaki, Japan

[21] Appl. No.: 09/072,987

[22] Filed: May 6, 1998

[30] Foreign Application Priority Data

May 7, 1997 [JP] Japan ................................ 9-116753
Mar. 24, 1998 [JP] Japan ............................... 10-075343

[51] Int. Cl.$^6$ ................................................. G11C 16/04
[52] U.S. Cl. ...................... 365/185.14; 257/316; 257/508
[58] Field of Search ........................ 365/185.14; 257/314, 257/315, 316, 319, 508

[56] References Cited

U.S. PATENT DOCUMENTS 5,557,565  9/1996  Kaya et al. ......................... 365/185.14

OTHER PUBLICATIONS

W.C. Shin et al., "A New Shared Bit Line NAND Cell Technology for the 256 Mb Flash Memory with 12V Programming", 1996 IEDM.

J.D. Choi, et al., "A Novel Booster Plate Technology in High Density NAND Flash Memories for Voltage Scaling–Down and Zero Program Disturbance", 1996 Symposium on VLSI Technology Digest of Technical Papers, pp. 238–239.

*Primary Examiner*—David Nelms
*Assistant Examiner*—David Lam
*Attorney, Agent, or Firm*—Finnegan, Henderson, Farabow, Garrett & Dunner, L.L.P.

[57] ABSTRACT

The non-volatile semiconductor device includes a sub control gate in addition to the conventional structure having a control gate and a floating gate. When writing or erasing is performed, by applying various to the control gate and the sub control gate, the potential of the floating gate which is capacitively connected to the control and sub control gates is determined. Accordingly, the floating gate voltage is maintained at lower control voltage compared to conventional one by selecting larger coupling ratio. The sub control gate covering a part where charge concentration apt to occur avoids charge concentration and deterioration of the tunnel oxide film.

13 Claims, 11 Drawing Sheets

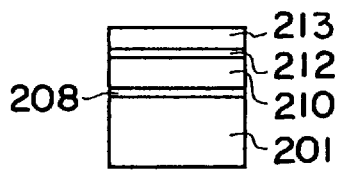
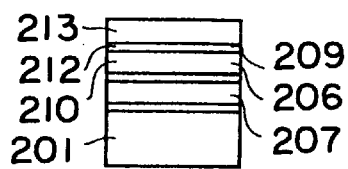
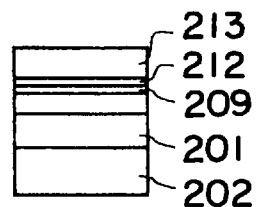
FIG.13LA  FIG.13LB  FIG.13LC
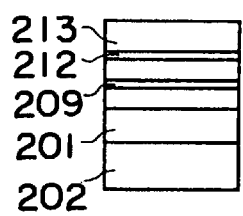
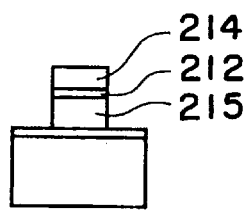
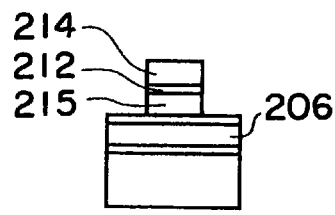
FIG.13LD  FIG.13MA  FIG.13MB
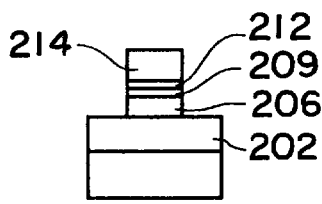
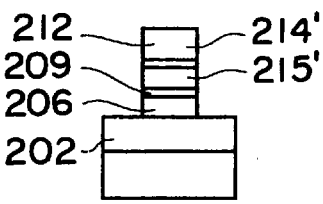
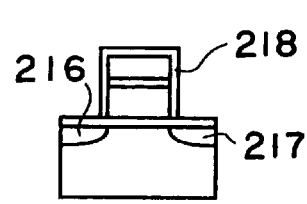
FIG.13MC  FIG.13MD  FIG.13NA
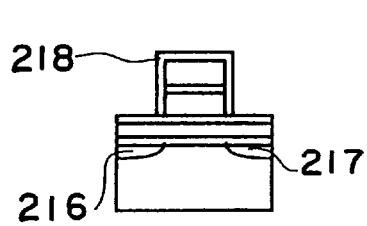
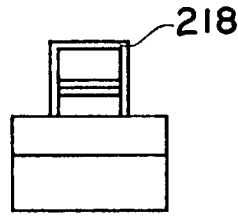
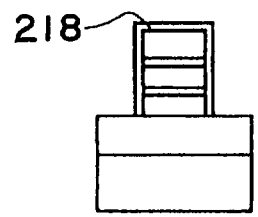
FIG.13NB  FIG.13NC  FIG.13ND

NON-VOLATILE SEMICONDUCTOR MEMORY DEVICE AND METHOD OF MANUFACTURING NON-VOLATILE SEMICONDUCTOR MEMORY DEVICE

BACKGROUND OF THE INVENTION

1. Field of the Invention

The present invention relates to a non-volatile semiconductor memory device and a method of manufacturing the non-volatile semiconductor device.

2. Related Background Art

FIGS. 1A and 1B show a conventional cell structure of a non-volatile semiconductor memory device such as UV PROM, OTP (One-Time PROM), EEPROM, Flash EEPROM.

As illustrated in FIG. 1A, the conventional non-volatile memory cell is constructed of a pair of element isolation regions 402 on a semiconductor substrate 401, cell forming regions separated by the element isolation regions 402, gate oxide layer 403 formed over this cell forming region, a floating gate 404 provided on the gate oxide layer 403, and a control gate electrode 406 provided through the floating gate 404 and an insulating layer 405. Further, an inter-poly insulating layer 407 and a BPSG layer 410 are provided on the control gate electrode 406. Moreover, a wiring layer 412 composed of Al etc is provided, and a passivation layer 413 is then provided thereon.

FIG. 1B is a sectional view taken along the line A-A' in FIG. 1A. The reference numerals 408 and 409 designate a source diffusion layer region and a drain diffusion layer region, respectively. The Al wiring layer 412 is connected via a contact hole to the source or drain region.

Let VCG be an electric potential of the control gate electrode 406 (which is hereinafter referred to as a control gate potential), VFG be an electric potential of the floating gate electrode 404 (which is hereinafter be termed a floating gate potential), and Vsub be an electric potential of the semiconductor substrate 401 (which is hereinafter be called a substrate potential), and further let C1 be a capacity between the semiconductor substrate 401 and the floating gate electrode 404 (which is hereinafter be referred to as an inter substrate-floating gate capacity), and C2 be a capacity between the floating gate electrode 404 and the control gate electrode 406 (which is hereinafter be termed an inter floating gate-control gate capacity), wherein an equivalent circuit of the prior art memory cell can be expressed as shown in FIG. 2. From this equivalent circuit, the floating gate potential can be given such as:

$$VFG = \frac{C_2}{C_1 + C_2} VCG \quad \text{[Formula 1]}$$

At this time, the following is called a coupling ratio:

$$\frac{C_2}{C_1 + C_2} \quad \text{[Formula 2]}$$

Namely, the capacity components C1, C2 are assumed to be constants, in which case the floating gate potential VFG is determined by the control gate potential VCG and the coupling ratio. Writing and erasing to and from the memory cell are conducted depending on this floating gate potential VFG. The writing and erasing operations with respect to each of the memory cells will be explained.

The EPROM among the non-volatile semiconductor memory devices involves the use of an injection of channel hot electrons in the writing process and ultraviolet rays in the erasing process. Further, the OTP involves the use of the injection of channel hot electrons in the writing process as in the case of the EPROM, and no erasing process is done because of being sealed in a package. On the other hand, the EEPROM and the Flash EEPROM are each defined as an electrically erasable and programmable read only memory, and involve the use of the above-described channel hot electron injection or a Fowler-Noldheim current (hereinafter referred to as an FN tunnel current) in the writing process. Further, the erasing process is executed based on the FN tunnel current.

The channel hot electron injection is conducted using the channel hot electrons generated with pinchoff in the vicinity of the drain of the channel region by setting, e.g., the control gate potential to 10V, a drain voltage to 7V and a source voltage to an earth potential. At this time, as shown in the formula 1, the hot electrons are injected into the floating gate by the floating gate potential determined by the control gate potential VCG, the inter substrate-floating gate capacity C1 and the inter floating gate-control gate capacity C2.

The writing and erasing based on the FN tunnel current entail an injection and an emission of electric charges by applying an electric field as high as 6 MV/cm or larger to the floating gate electrode 404 and the inter semiconductor substrate gate insulating layer 403. As for the EEPROM, this gate insulating layer 403 is generally called a tunnel oxide layer 404 a thickness of which is on the order of 10 nm. For generating the FN tunnel current, a high voltage must be applied to this tunnel oxide layer 403. For example, if the coupling ratio shown in the formula 2 is approximately 0.6, a voltage as high as approximately 20 V must be applied to the control gate electrode or the semiconductor substrate 401.

Thus, the typical non-volatile memory requires the high voltage for the writing and erasing processes, and for this reason a peripheral circuit is hard to be downsized in terms of attaining its high integration. Further, if a power supply voltage is single, an internal step-up circuit must be incorporated thereinto, and this might lead to a first problem in which it is difficult to downsize the LSI.

Another problem is a deterioration of the tunnel oxide layer in the case of the writing and erasing processes based on the FN tunnel current. This deterioration is caused by the electrons being trapped into the oxide layer due to a passage of the FN current. This trapping might deteriorate writing/erasing characteristics of the memory cell or might cause a fluctuation of a threshold value Vth, resulting in a data mis-judgement or a writing/erasing enable state, which becomes a cause of a detect. Especially, this phenomenon, if there exists a thin region in the tunnel oxide layer, might get conspicuous because of the electric current being concentrated on this thin region. Normally, a thick field oxide layer is formed for the device separation, however, the tunnel oxide layer at the edge of the field oxide layer tends to be formed thinner by over several % than other regions (IEEE Trans, Electron Device (USA) Vol. 42, No.12).

FIG. 3 is an enlarged view showing a field oxide layer edge 414 in FIGS. 1A and 1B, wherein a thinned region 501 exists at the edge of LOCOS. Therefore, it follows that the deterioration advances in the thinned region 501.

Further, a tendency in recent years is that trench isolation is adopted for a device separation. FIG. 4 shows a structure of a memory cell in which the trench isolation is adopted for the EEPROM. The memory cell is constructed of a pair of device isolation regions 602 on a semiconductor substrate 601, a cell forming region separated by the device isolation region 602, a gate oxide layer 603 formed on this cell forming region, a floating gate 604 formed on the gate oxide layer 603, and a control gate electrode 606 provided via the floating gate 604 and the insulating layer 605. Further, an inter-poly insulating layer 607 and a BPSG layer 610 are provided on the control gate electrode 406. Moreover, a wiring layer 612 of Al etc is provided, and then a passivation layer 613 is provided. FIG. 5 is an enlarged view illustrating a trench corner 614 in FIG. 4. As shown in FIG. 5, an electric field concentrates at the trench corner, and a deterioration of withstanding pressure of the tunnel oxide layer might be thereby caused.

Thus, when executing the writing/erasing processes based on the FN tunnel current, a second problem might also arise, wherein the tunnel oxide layer is deteriorated due to the concentration of the electric field at the LOCOS edge or at the trench corner.

SUMMARY OF THE INVENTION

It is a first object of the present invention to provide a non-volatile semiconductor memory device capable of actualizing a reduction in a chip areal size by downsizing a peripheral circuit.

It is a second object of the present invention to provide a method of manufacturing a non-volatile semiconductor memory device capable of actualizing a reduction in a chip areal size by downsizing a peripheral circuit.

It is a third object of the present invention to provide a non-volatile semiconductor memory device capable of actualizing an enhancement of reliability with a restraint of deterioration of a tunnel oxide layer by avoiding the writing/erasing processes from being executed at a portion where electric charges are easy to concentrate.

It is a fourth object of the present invention to provide a method of manufacturing a non-volatile semiconductor memory device capable of actualizing an enhancement of reliability with a restraint of deterioration of a tunnel oxide layer by avoiding the writing/erasing processes from being executed at a portion where electric charges are easy to concentrate.

According to the first aspect of the present invention, there is provided a non-volatile semiconductor memory device comprising:

a device isolation region selectively formed on a semiconductor substrate;

a region interposed between said device isolation regions;

a first gate electrode so selectively formed as to exist on at least said device isolation region;

a first gate insulating layer formed on a region interposed between said first gate electrodes;

a first insulating layer formed on said first gate electrode and on a side surface thereof;

a second gate electrode formed on said first insulating layer and on said first gate insulating layer, and so selectively formed that at least a part of said second gate electrode is overlapped with said first gate electrode;

a second insulating layer formed on said second gate electrode and on a side surface thereof;

a third gate electrode formed on said first and second gate electrodes via said first and second insulating layers; and drain and source diffusion layered regions formed on both sides of said second gate electrode in said region interposed between said device isolation regions.

According to the second aspect of the present invention, there is provided a non-volatile semiconductor memory device comprising:

a device isolation region selectively formed on a semiconductor substrate;

a region interposed between said device isolation regions;

a first gate electrode selectively formed so that said first gate electrode exists on at least said device isolation region, and that an edge portion thereof exists on said device isolation region;

a first gate insulating layer formed on a region interposed between said first gate electrodes;

a first insulating layer formed on said first gate electrode and on a side surface thereof;

a second gate electrode formed on said first gate insulating layer and on said first insulating layer, and so selectively formed that at least a part of said second gate electrode is overlapped with said first gate electrode;

a second insulating layer formed on said second gate electrode and on a side surface thereof;

a third gate electrode formed on said first and second gate electrodes via said first and second insulating layers; and drain and source diffusion layered regions formed on both sides of said second gate electrode in said region interposed between said device isolation regions, wherein memory data thereof indicates "0" or "1" depending on whether or not electric charges are injected into said second gate electrode.

According to the third aspect of the present invention, there is provided a non-volatile semiconductor memory device comprising:

a device isolation region selectively formed on a semiconductor substrate;

a region interposed between said device isolation regions;

a first gate electrode selectively formed so that said first gate electrode exists on at least said device isolation region, and that an edge portion thereof exists on said region interposed between said device isolation regions;

a first gate insulating layer formed on a region interposed between said first gate electrodes;

a first insulating layer formed on said first gate electrode and on a side surface thereof;

a second gate electrode formed on said first gate insulating layer and on said first insulating layer, and so selectively formed that at least a part of said second gate electrode is overlapped with said first gate electrode;

a second insulating layer formed on said second gate electrode and on a side surface thereof;

a third gate electrode formed on said first and second gate electrodes via said first and second insulating layers; and drain and source diffusion layered regions formed on both sides of said second gate electrode in said region interposed between said device isolation regions, wherein memory data thereof indicates "0" or "1" depending on whether or not electric charges are injected into said second gate electrode.

According to the fourth aspect of the present invention, there is provided a non-volatile semiconductor memory device comprising:

a plurality of memory cells connected in series, said memory cell including:
   a device isolation region selectively formed on a semiconductor substrate;
   a region interposed between said device isolation regions;
   a first gate electrode so selectively formed as to exist on at least said device isolation region;
   a first gate insulating layer formed on a region interposed between said first gate electrodes;
   a first insulating layer formed on said first gate electrode and on a side surface thereof;
   a second gate electrode formed on said first gate insulating layer and on said first insulating layer, and so selectively formed that at least a part of said second gate electrode is overlapped with said first gate electrode;
   a second insulating layer formed on said second gate electrode and on a side surface thereof;
   a third gate electrode formed on said first and second gate electrodes via said first and second insulating layers; and
   drain and source diffusion layered regions formed on both sides of said second gate electrode in said region interposed between said device isolation regions.

According to the fifth aspect of the present invention, there is provided a method of manufacturing a non-volatile semiconductor memory device, comprising the steps of:

selectively forming a device isolation region on a semiconductor substrate;

forming a first insulating layer on a region interposed between said device isolation regions;

forming a first conductive layer on said first insulating layer and on said device isolation region;

selectively removing a portion interposed between said device isolation regions and said first conductive layer formed on a part of said device isolation region, and forming a first gate electrode existing on at least said device isolation region and having its edge portion existing on said device isolation region;

removing said first insulating layer;

forming a second insulating layer on a region interposed between said first gate electrodes and on said first gate electrode;

forming a second conductive layer on said second insulating layer;

selectively removing said second conductive layer on said first gate electrode, and forming a second gate electrode isolation region;

forming a third insulating layer on said second conductive layer and on said second gate electrode isolation region;

forming a third conductive layer on said third insulating layer;

forming a third gate electrode and a second gate electrode by selectively etching said third conductive layer, said third insulating layer and said second conductive layer by use of photolithography and anisotropic etching;

forming a diffusion layer on the surface of said semiconductor substrate which excludes said device isolation region and a region covered with said third gate electrode;

forming and flattening a fourth insulating layer on said device isolation region, said diffusion layer, said first gate electrode, said second gate electrode and said third gate electrode;

forming contact holes in said third gate electrode, said first gate electrode and said diffusion layer through said fourth insulating layer; and forming a metal wiring layer on said contact holes.

According to the sixth aspect of the present invention, there is provided a method of manufacturing a non-volatile semiconductor memory device, comprising the steps of:

selectively forming a pair of device isolation regions on a semiconductor substrate;

forming a first insulating layer on a region interposed between said device isolation regions;

forming a first conductive layer on said first insulating layer and on said device isolation region;

selectively removing said first conductive layer formed on a part of portion interposed between said device isolation regions, and forming a first gate electrode existing on at least said device isolation region and having its edge portion existing on a region interposed between said device isolation regions;

removing said first insulating layer not covered with said first gate electrode;

forming a second insulating layer on a region interposed between said first gate electrodes and on said first gate electrode;

forming a second conductive layer on said second insulating layer;

selectively removing said second conductive layer on said first gate electrode, and forming a second gate electrode isolation region;

forming a third insulating layer on said second conductive layer and on said second gate electrode separating region;

forming a third conductive layer on said third insulating layer;

forming a third gate electrode and a second gate electrode by selectively etching said third conductive layer, said third insulating layer and said second conductive layer by use of photolithography and anisotropic etching;

forming a diffusion layer on the surface of said semiconductor substrate which excludes said device isolation region and a region covered with said third gate electrode;

forming and flattening a fourth insulating layer on said device isolation region, said diffusion layer, said first gate electrode, said second gate electrode and said third gate electrode;

forming contact holes in said third gate electrode, said first gate electrode and said diffusion layer through said fourth insulating layer; and a step of forming a metal wiring layer on said contact holes.

DESCRIPTION OF THE PREFERRED EMBODIMENTS

Embodiments of the present invention will hereinafter be described with reference to the accompanying drawings.

FIGS. 6A–6I show steps in a method of manufacturing a non-volatile semiconductor memory device in accordance with a first embodiment of the present invention.

Figure 1A:
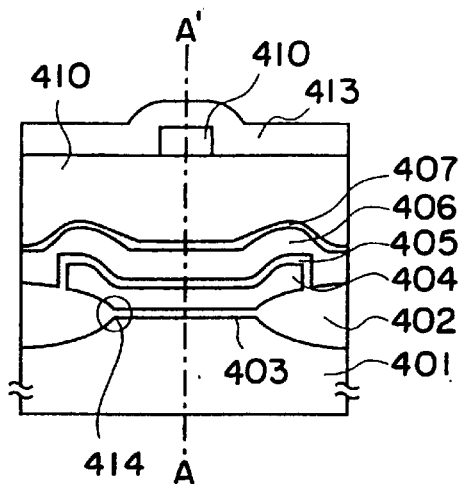
FIGS. 1A and 1B are diagrams showing a structure of a prior art non-volatile semiconductor memory device.
Figure 1B:
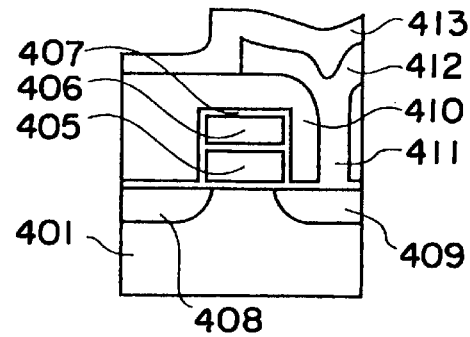
Figure 2:
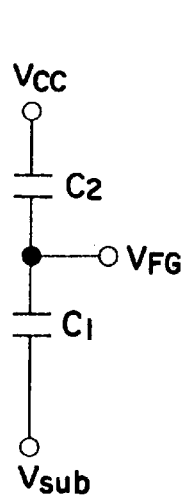
FIG. 2 is a diagram showing an equivalent circuit of the prior art non-volatile semiconductor memory device.
Figure 3:
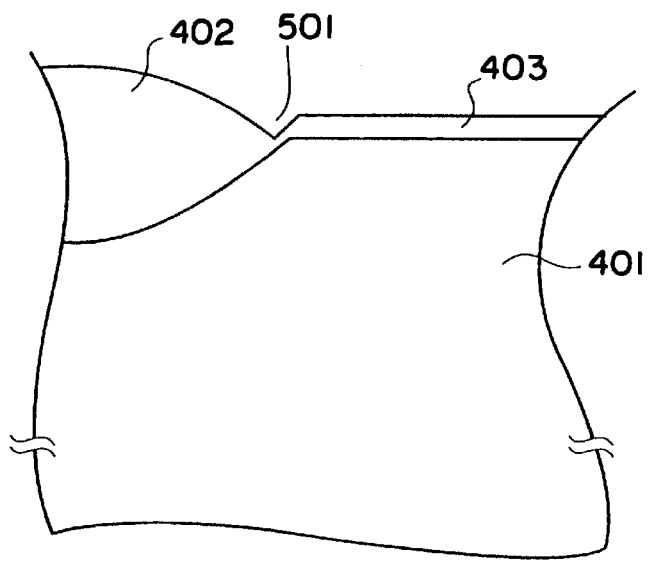
FIG. 3 is an enlarged view showing a LOCOS edge in FIG. 1.
Figure 4:
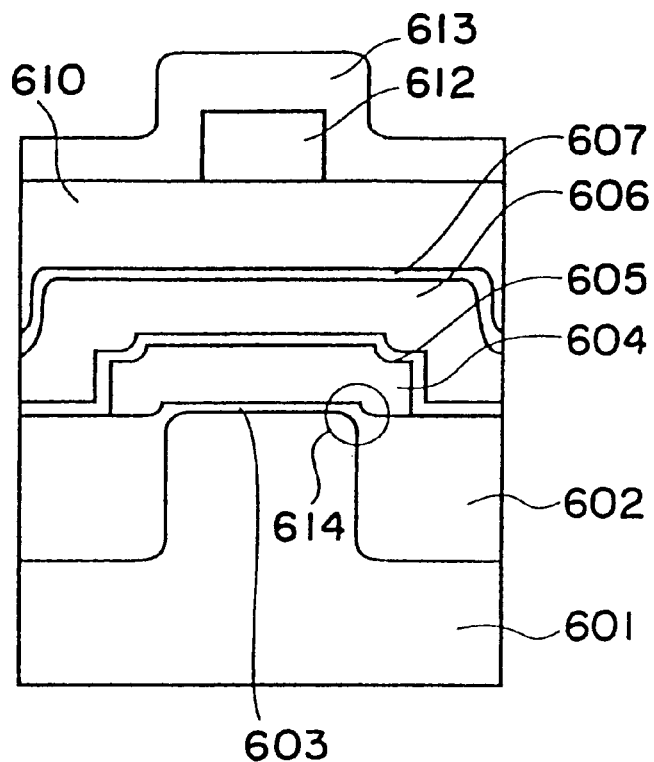
FIG. 4 is a diagram showing a structure of a prior art trench isolation type non-volatile semiconductor memory device.
Figure 5:
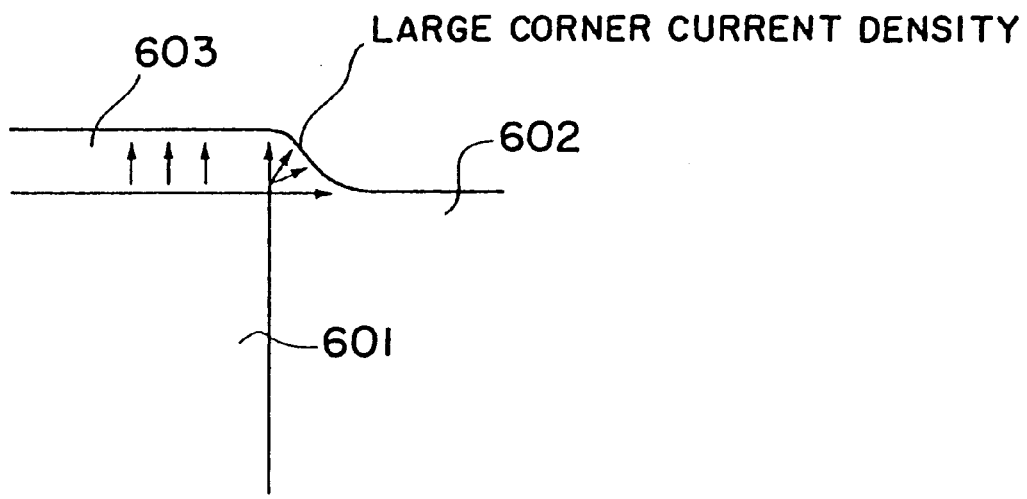
FIG. 5 is an enlarged view showing a trench corner in FIG. 4.
Figure 6A:
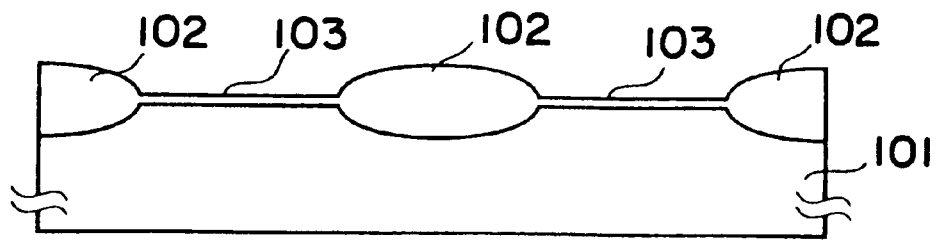
FIGS. 6A–6I are diagrams showing a step of manufacturing a non-volatile semiconductor memory device in a first embodiment of the present invention.

To start with, a device isolation region is formed on a P-type semiconductor substrate 101 by a usual LOCOS method, and an oxide layer 103 having a thickness of 20 nm is formed in, e.g., a dry $O_2$ atmosphere at 800° C. in a region excluding the device isolation region (FIG. 6A).

Figure 6B:
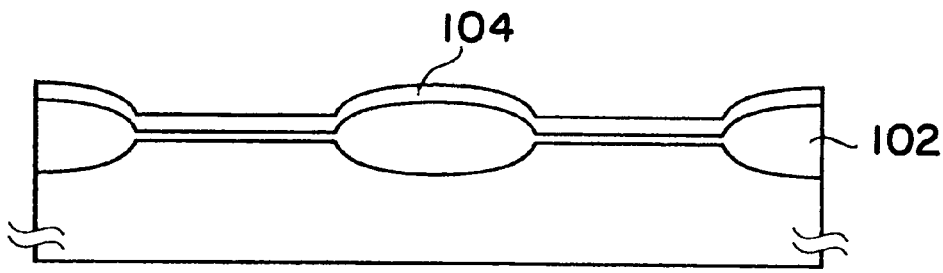

Next, polysilicon 104 is deposed up to 50 nm by a LPCVD (Low Pressure Chemical Vapor Deposition) method (FIG. 6B). At this time, in order to attain a reduced resistance with respect to the polysilicon 104, phosphorous (P) ion is diffused by annealing in, e.g., a $POCl_3$ atmosphere at 850° C., and thereafter a silicon oxide layer provided on the surface of the polysilicon 104 is removed by $NH_4F$. Alternatively, a desired resistance is obtained by implanting P or As ions by way of the ion implantation.

Figure 6C:
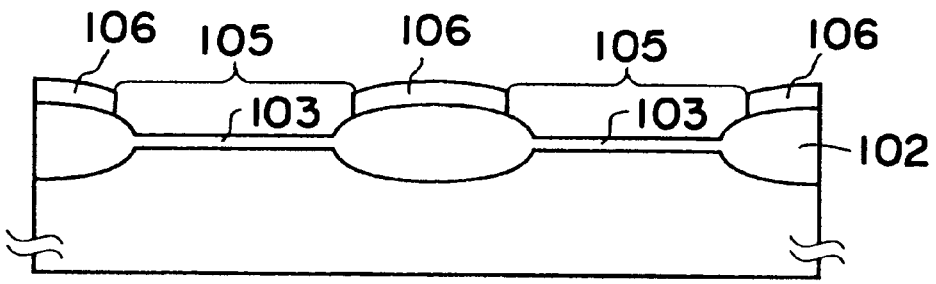
Figure 6D:
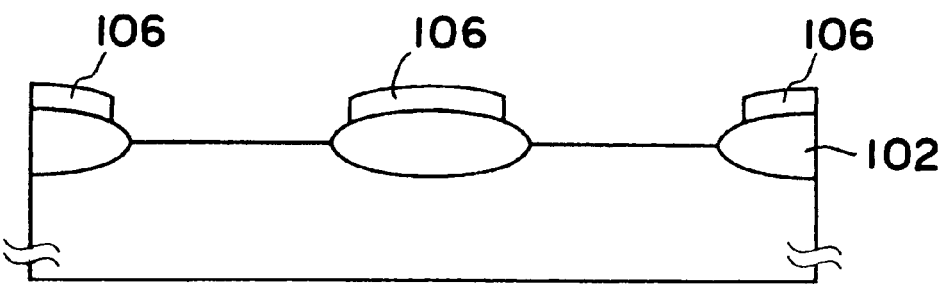
Figure 6E:
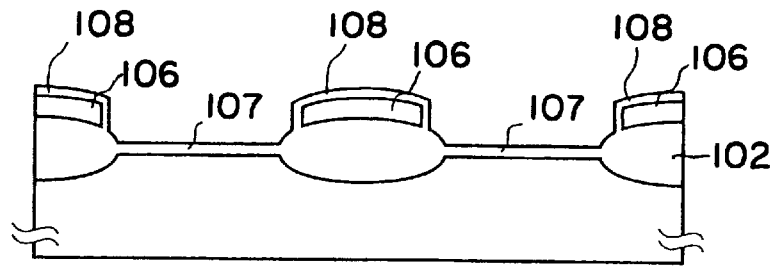
Figure 6F:
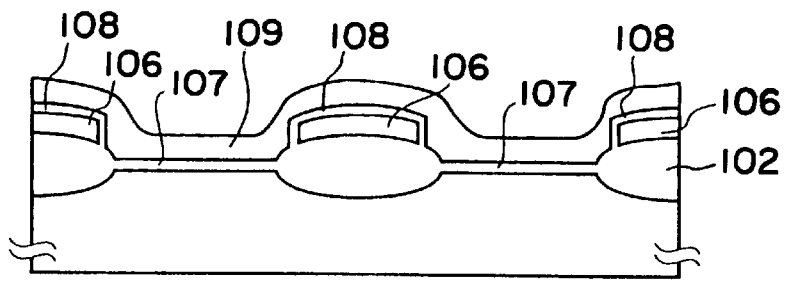
Figure 6G:
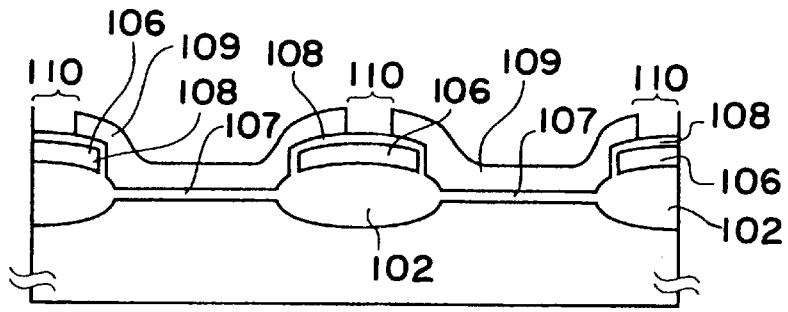
Figure 6H:
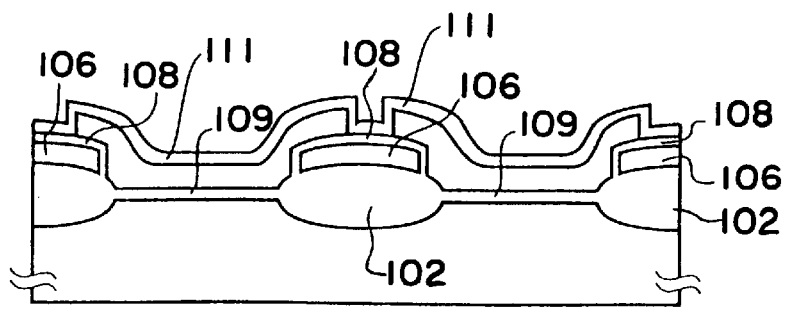

Next, the polysilicon 104 partly existing on the device isolation region 105 as well as on a regions interposed between the device isolation regions, is selectively etched by use of photolithography and RIE (Reactive Ion Etching), thereby forming a first gate electrode (hereinafter referred to as a sub control gate electrode) 106 (FIG. 6C).

Next, the oxide layer 103 is removed by using $NH_4F$ with the sub control gate electrode 106 serving as a mask (FIG. 6C).

Subsequently, a gate oxide layer 107 of 10 nm, which becomes a tunnel oxide layer, is formed in, e.g., the dry $O_2$ atmosphere at 800° C. on the region 105 interposed between the sub control gate electrodes 106. At this time, an oxide layer 108 is also provided on the sub control gate electrode 106, however, the silicon to which an impurity is added is generally oxidized at a higher oxidation rate than an oxidation rate of non-doped silicon oxidized at an increased rate. Accordingly, the oxide layer 108 is formed to have an oxide layer thickness of 10 nm or larger (approximately 20 nm although depending on an impurity concentration) on the sub control gate electrode 106.

Next, polysilicon 109 serving as a second gate electrode (hereinafter called a floating gate electrode) is deposited up to 50 nm by the LPCVD method (FIG. 6). At this moment, in order to attain a reduced resistance with respect to the polysilicon, P is diffused by annealing in, e.g., the $POCl_3$ atmosphere at 850° C., and thereafter a silicon oxide layer provided on the surface of the polysilicon is removed by $NH_4F$. Alternatively, a desired resistance is obtained by implanting P or As by way of the ion implantation.

Figure 7A:
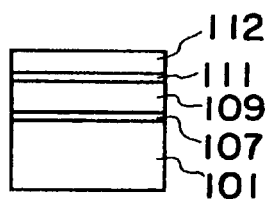
FIGS. 7A–7C are diagrams showing a step of manufacturing the non-volatile semiconductor memory device in the first embodiment of the present invention.
Figure 7B:
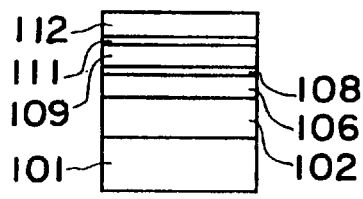
Figure 7C:
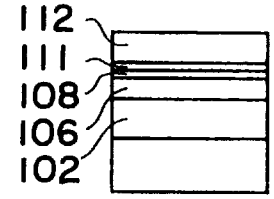

Next, the polysilicon 109 on the device isolation region 102 is selectively etched by use of the photolithography and the RIE (Reactive Ion Etching), thereby forming a floating gate separating region 110 (FIG. 7).

Next, an oxide layer 111 that is 20 nm thick is provided on the polysilicon 109 in, e.g., the dry $O_2$ atmosphere at 800° C. (FIG. 8). Alternatively, there may also be formed a $SiO_2$—SiN—$SiO_2$ stacked layer, a so-called an ONO (Oxide-Nitride-Oxide) layer as thick as 20 nm.

Subsequently, polysilicon 112 serving as a third gate electrode (hereinafter termed a main control gate electrode) is deposited up to, e.g., 400 nm (FIG. 9). At this time, for attaining a reduced resistance with respect to poly Si, P is diffused by annealing in, e.g., the $POCl_3$ atmosphere at 850° C., and thereafter a silicon oxide layer provided on the surface of the polysilicon is removed by $NH_4F$. If a low-resistance material is requested of the main control gate electrode, a metal silicide such as WSi may be formed on the polysilicon by a sputtering method or an LPCVD method etc.

Figure 6I:
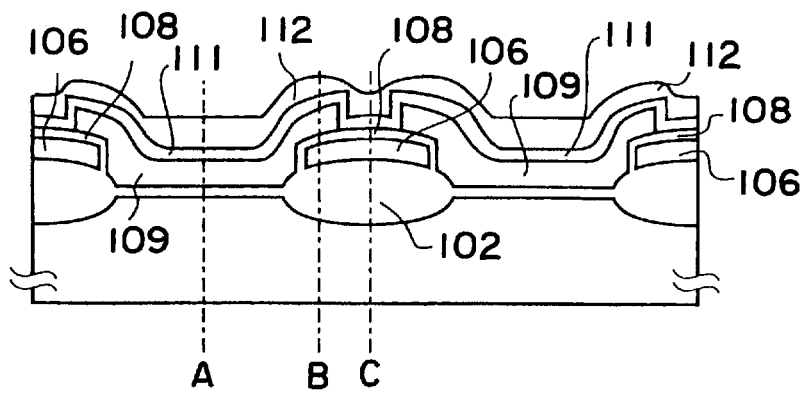

FIGS. 7A–7C, 8A–8C, and 9A–9C are sectional views of three steps taken substantially along the lines A, B and C in FIG. 6I. Then, the steps which follow are explained in sequence.

Figure 8A:
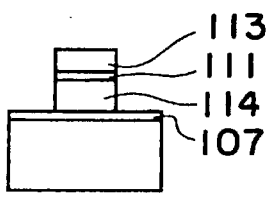
FIGS. 8A–8C are diagrams showing a step of manufacturing the non-volatile semiconductor memory device in the first embodiment of the present invention.
Figure 8B:
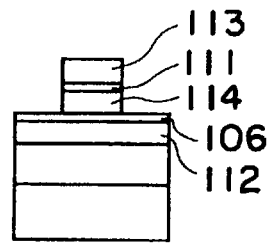
Figure 8C:
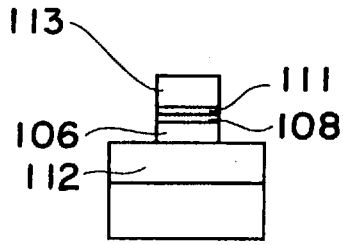
Figure 9A:
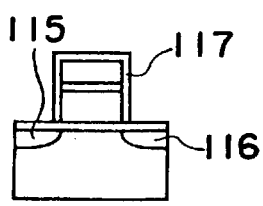
FIGS. 9A–9C are diagrams showing a step of manufacturing the non-volatile semiconductor memory device in the first embodiment of the present invention.
Figure 9B:
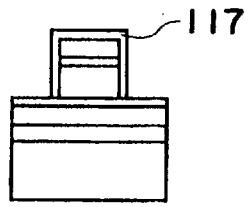
Figure 9C:
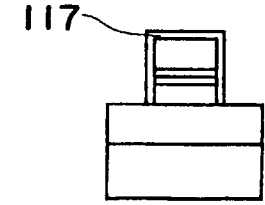

Polysilicon 112 is selectively etched by use of the photolithography and the RIE, and subsequently an oxide layer 111 and polysilicon 109 are etched in self-alignment, thereby forming a main control gate electrode 113 and a floating gate electrode 114 (FIGS. 8A–8C). Next, with the main control gate electrode 113 and the floating gate electrode 114 serving as a mask, P or As is implanted by the ion implantation method, thereby forming a source diffusion layer 115 and a drain diffusion layer 116. Next, a RIE damage is recovered, and P or As implanted is activated. For this purpose, an oxide layer 117 is formed in, e.g., the dry $O_2$ atmosphere at 800° C. (FIGS. 9A–9C).

Figure 10A:
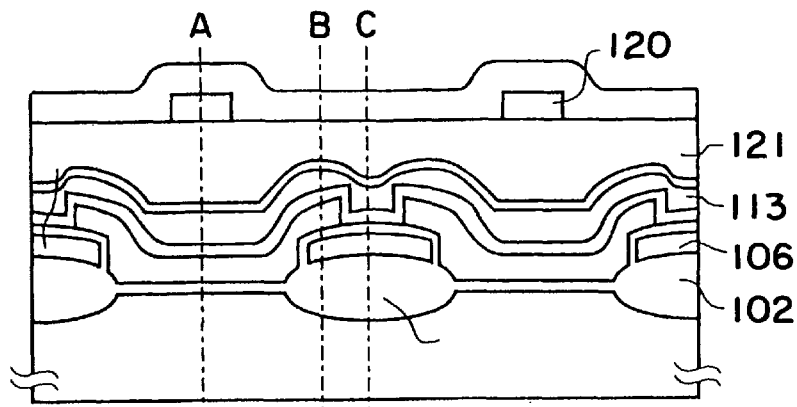
FIGS. 10A and 10B are diagrams showing a step of manufacturing the non-volatile semiconductor memory device in the first embodiment of the present invention.

Next, by a typical LSI manufacturing technique, a BPSG layer 118 is deposited and flattened, contact holes 119 are formed on the main control gate electrode 113, the sub control gate electrode 106, the source diffusion layer 115 and the drain diffusion layer 116, an Al wiring layer 120 is provided, a passivation layer 121 is formed of, e.g., a SiN/SiO$_2$ stacked layer by a plasma CVD method, and finally a pad is formed with a hole (FIG. 10A).

Figure 10B:
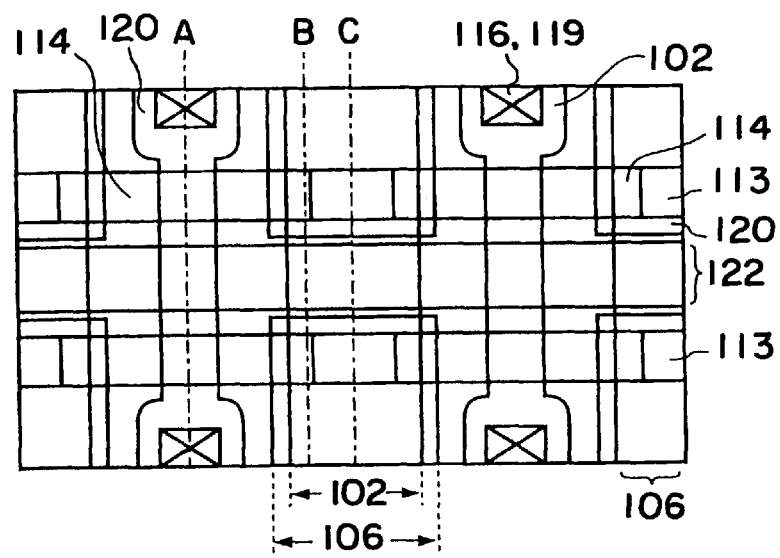

The non-volatile semiconductor memory device in the first embodiment of the present invention is actualized by the steps described above. In the case of actualizing the LSI by arranging these memory cells in matrix, a plan structure as illustrated in FIG. 10B is taken. Herein, the sub control gate electrode 106 traverses a common source line 122, and hence it is required that As be previously ion-implanted before depositing the polysilicon 104 serving as the sub control gate electrode, and that an embedded source line 122 be thus formed.

Figure 11:
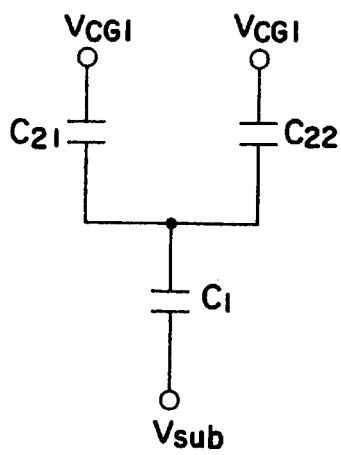
FIG. 11 is a diagram showing an equivalent circuit of the non-volatile semiconductor memory device of the present invention.

Although, the first embodiment has been discussed so far by explaining the steps in sequence, FIG. 11 illustrates an equivalent circuit of the memory cell of the non-volatile semiconductor memory device in the first embodiment. Let C21 be a capacity between the floating gate electrode and the control gate electrode, C22 be a capacity between the floating gate electrode and the sub control gate electrode, VCG1 be a control gate electrode potential, and VCG2 be a sub control gate electrode potential, a floating gate electrode potential VFG is given by:

$$VFG = \frac{(C_{21} \cdot VCG1 + C_{22} \cdot VCG2)}{C_1 + C_{21} + C_{22}} \quad \text{[Formula 3]}$$

Then, $$VCG1 = VCG2 = VCG \quad \text{[Formula 4]}$$

When thus assumed, the following formula can be expressed such as:

$$VFG = \frac{(C_{21} + C_{22})}{(C_1 + C_{21} + C_{22})} VCG$$

In this case, the coupling ratio is given by:

$$\frac{C_{21} + C_{22}}{C_1 + C_{21} + C_{22}}$$

Thus, according to the non-volatile semiconductor device of the present invention, the electrostatic capacity between the floating gate electrode and the control gate becomes the capacity of the floating gate electrode for both of the control gate electrode and the sub control gate electrode, and therefore the coupling ratio can be set larger than that in the prior art. Namely, it is feasible to obtain the floating gate voltage (VFG) when in the conventional writing/erasing processes at a lower writing/erasing voltage than in the prior art.

Table 1 shows a bias condition when operated, wherein the first embodiment of the present invention is applied to an NOR type non-volatile memory cell. Each of the control gate electrode voltage VCG1 and the sub control gate voltage VCG2 when in the writing process becomes Vppw, a value of which is lower than the writing electric potential in the prior art.

TABLE 1

|  | Erasing Operation | Writing Operation | Reading Operation |
|---|---|---|---|
| Control Gate Electrode Voltage VGG1 | 0V | Vppw | Vcc |
| Sub Control Gate Electrode Voltage VGG2 | 0V | Vppw | 0V |
| Drain Voltage Vd | open | Vd | Vcc |
| Source Voltage Vs | Vppe | 0V | 0V |
| Substrate Voltage Vsub | 0V | 0V | 0V |

Vppw: Writing Potential
Vppe: Erasing Potential
Vcc: Power Source Potential
Vd: Drain Potential
Vs: Source Potential
Vsub: Substrate Potential Table 2 shows a bias condition when operated, wherein the first embodiment of the present invention is applied to a NAND type non-volatile memory cell. The operation of the NAND type Flash EEPROM is described in, e.g., "A 35 ns Cycle Time 3.3V Only 32 Mb NAND Flash EEPROM" (IEEE J. Solid-state Circuits, pp.1157–1164, Vol.30, November, 1995).

TABLE 2

|  | Erasing Operation | Writing Operation "0v" | Writing Operation "1" | Reading Operation |
|---|---|---|---|---|
| Control Gate Electrode Voltage in Selective State | 0V | Vppw | Vppw | 0V |
| Sub Control Gate Electrode Voltage | 0V | Vppw | Vppw | 0V |
| Drain Voltage | open or Vppe | 0V | Vmbl | Vcc |
| Source Voltage | open or Vppe | 0V or open | 0V or open | 0V |
| Substrate Voltage | Vppe | 0V | 0V | 0V |
| Control Gate Electrode Voltage in Non-selective State |  | 0V or Vmwl | 0V or Vmwl | Vcc |
| Selection Transistor | Vppe | Vmwl | Vmwl | Vcc |

Vppw: Writing Potential
Vppe: Erasing Potential
Vmbl: Power Source Potential

According to the NAND type Flash EEPROM in the first embodiment of the present invention, the erasion can be done by setting a substrate voltage Vsub to an erasing electric potential Vppe as well as by setting the control gate electrode voltage VCG1 and the sub control gate voltage VCG2 down to 0V when in the erasing process. This erasing electric potential has a value lower than the erasing electric potential of the conventional NAND type Flash EEPROM. Similarly when in the writing process, the writing can be executed by setting the substrate voltage Vsub down to 0V and the control gate of the memory cell in a non-selective state down to 0V or a bit line intermediate electric potential Vmwl as well as by setting each of the control gate electrode voltage VCG1 and the sub control gate voltage VCG2 of the memory cell in a selective state to the writing electric potential Vppw. This writing electric potential Vppw has also a value smaller than the writing electric potential of the conventional NAND type Flash EEPROM. The reading process can be performed, wherein the sub control gate electrode voltage VCG2 is set to 0V, the control gate electrode voltage VCG1 of the memory cell in the selective state is set to 0V, and the control gate voltage of the memory cell in the non-selective state is set to VCG.

Thus, in the non-volatile semiconductor memory device in the first embodiment of the present invention, the applying electric potential when in the writing/erasing processes can be set smaller than in the prior art, and hence the peripheral circuit can be downsized. Further, if the power supply voltage is single, the internal step-up circuit can be downsized, whereby a chip areal size can be also made smaller than in the prior art.

Next, a second embodiment of the present invention will be described.

Figure 12A:
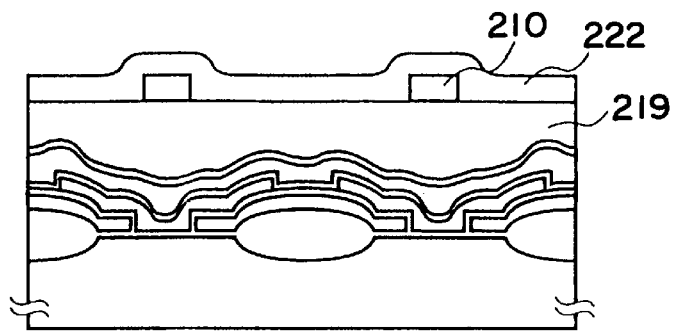
FIG. 12A and 12B are diagrams showing a structure of the non-volatile semiconductor memory device in the second embodiment of the present invention.
Figure 12B:
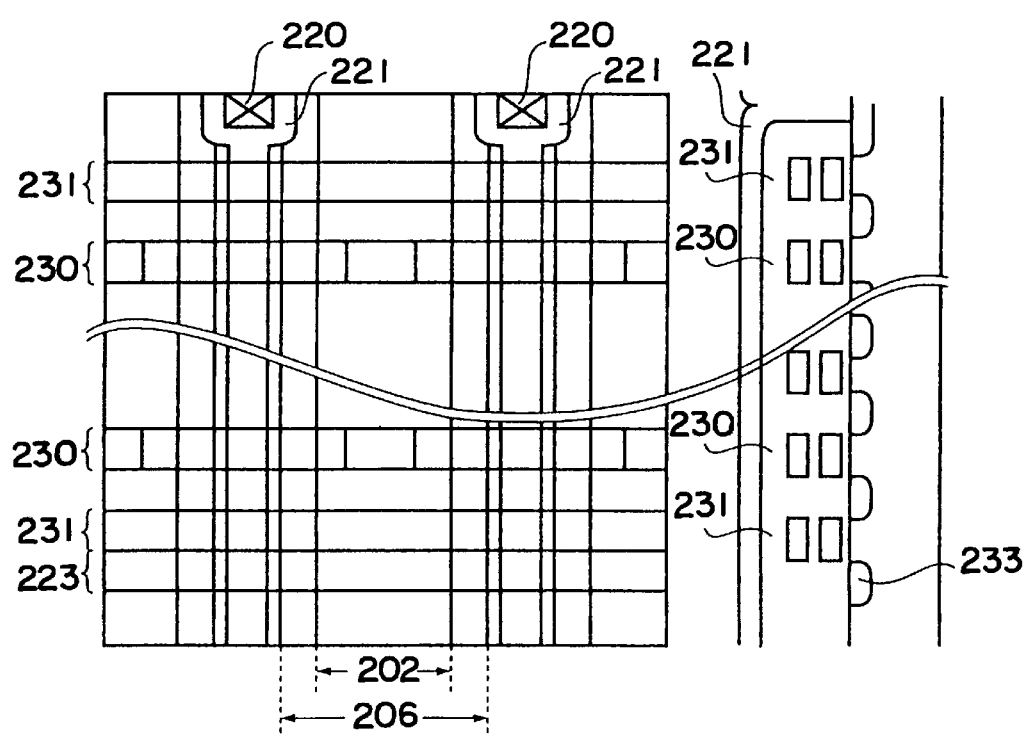

FIGS. 12A and 12B show a plan view and a sectional view of the NAND type Flash EEPROM actualized in the second embodiment of the present invention. The NAND type Flash EEPROM is constructed of a plurality of memory cell transistors 230 and selection transistors 231 disposed at both ends thereof.

Figure 13A:
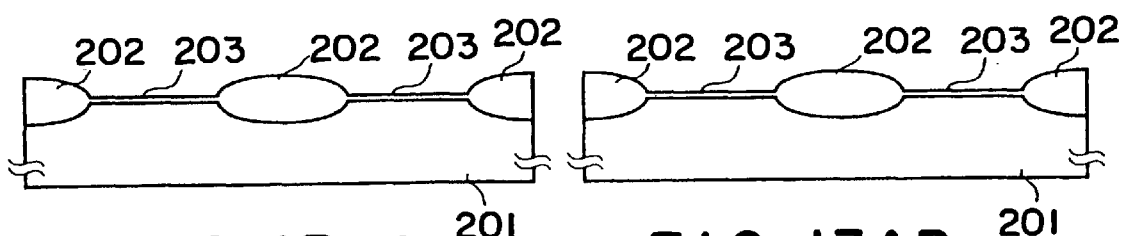
FIGS. 13AA–13KB and 13LA–13ND are diagrams showing a step of manufacturing the non-volatile semiconductor memory device in a second embodiment of the present invention.

A method of manufacturing the memory cell transistor 230 and the selection transistor 231 will be explained, following the steps shown in FIGS. 13AA–13ND. In FIGS. 13A–13K, the memory cell 230 is shown in figures with suffix A and the selection transistor 231 is shown with suffix B.

To begin with, a device isolation region 202 is selectively formed on a P-type semiconductor substrate 201 by the usual LOCOS method, and an oxide layer 203 having a thickness of 40 nm is formed in, e.g., the dry $O_2$ atmosphere at 800° C. in a region excluding the device isolation region (FIGS. 13AA and 13AB).

Figure 13B:
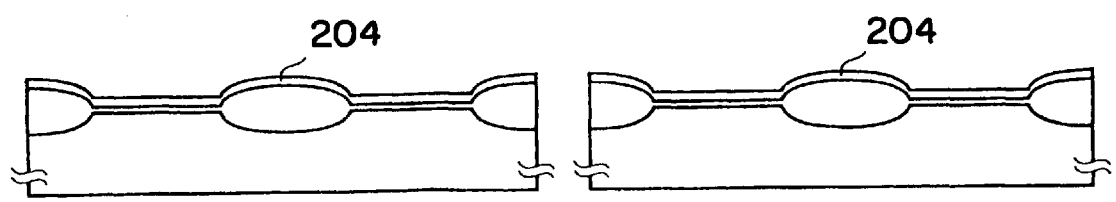

Next, polysilicon 204 is deposed up to 50 nm by the LPCVD method (FIGS. 13BA and 13BB). At this time, in order to attain a reduced resistance with respect to the polysilicon 204, P is diffused by annealing in, e.g., the POCl3 atmosphere at 850° C., and thereafter a silicon oxide layer provided on the surface of the polysilicon 504 is removed by NH₄F. Alternatively, a desired resistance is obtained by implanting P or As by way of the ion implantation.

Figure 13C:
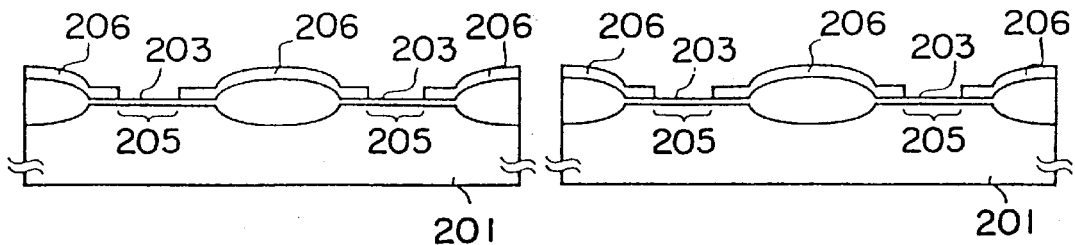

Next, the polysilicon 204 partly existing on the device isolation region 205 interposed between the device isolation regions, is selectively etched by use of the photolithography and the RIE (Reactive Ion Etching), thereby forming a first gate electrode (hereinafter referred to as a sub control gate electrode) 206 (FIGS. 13CA and 13CB).

Figure 13D:
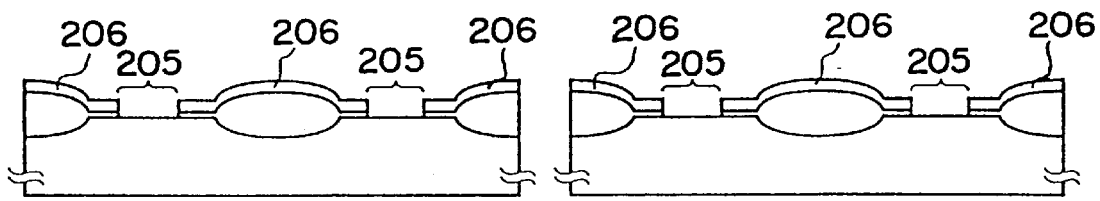

Next, the oxide layer 203 is removed by using NH₄F with the sub control gate electrode 206 serving as a mask (FIGS. 13DA and 13DB).

Figure 13E:
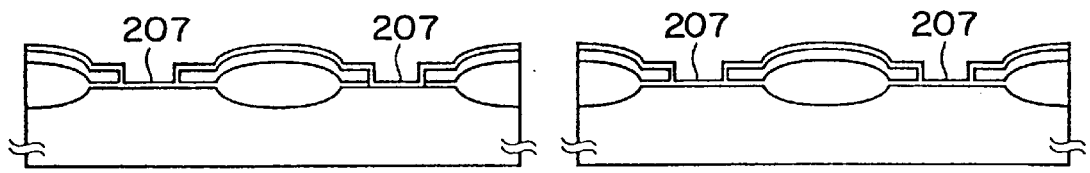

Subsequently, an oxide layer 207 having a thickness of 25 mm, which becomes a gate oxide layer (hereinafter called a selection gate oxide layer) of the selection transistor, is formed on a region 205 with the oxide layer 203 removed in the previous step in, e.g., the dry $O_2$ atmosphere at 800° C. (FIGS. 13EA and 13EB).

Figure 13F:
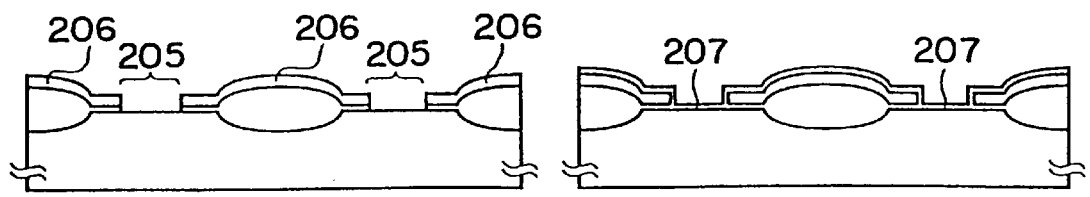

Next, in the memory cell region, the selection gate oxide layer 207 on the region 205 interposed between the sub control gate electrodes 206 in the memory cell region, is removed by the photolithography and the NH₄F etching (FIGS. 13FA and 13FB).

Figure 13G:
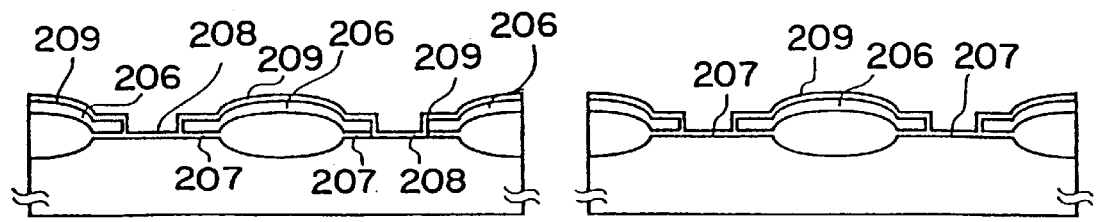

Next, in the memory cell region, a gate oxide layer 208 having a thickness of 10 nm, which becomes a tunnel oxide layer, is provided on the region 205 interposed between the sub control gate electrodes 206 (FIGS. 13GA and 13GB). At this time, an oxide layer 209 is provided also on the sub control gate electrode 206, however, the silicon to which an impurity is added is generally oxidized at a higher oxidation velocity than an oxidation velocity of non-doped silicon oxidized at an increased velocity. Accordingly, the oxide layer 209 is formed to have an oxide layer thickness of 10 nm or larger (approximately 20 nm although depending on an impurity concentration) on the sub control gate electrode.

Figure 13H:
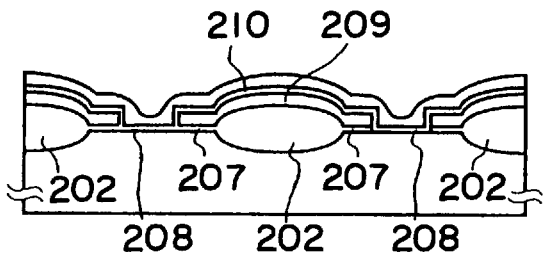
Figure 13H:
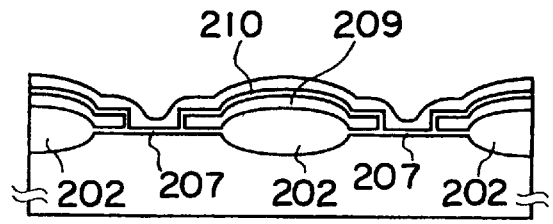

Next, polysilicon 210 is deposited up to 50 nm on the memory cell region and the selection transistor region as well by the LPCVD method (FIGS. 13HA and 13HB). At this moment, in order to attain a reduced resistance with respect to the polysilicon, P is diffused by annealing in, e.g., the POCl₃ atmosphere at 850° C., and thereafter a silicon oxide layer provided on the surface of the polysilicon is removed by NH₄F. Alternatively, a desired resistance is obtained by implanting P or As by way of the ion implantation.

Figure 13I:
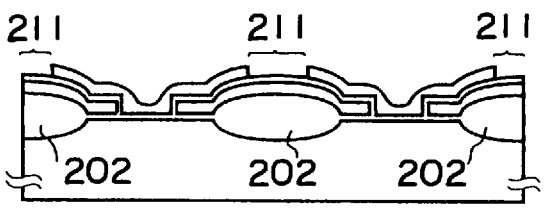
Figure 13I:
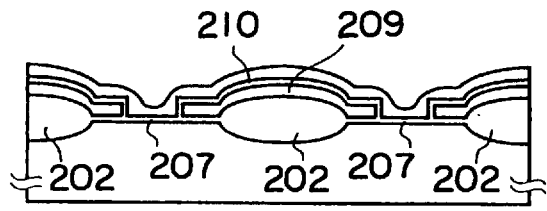

Next, in the memory cell region, a device separation region 211 is formed by use of the photolithography and the RIE (Reactive Ion Etching) (FIGS. 13IA and 13IB).

Figure 13J:
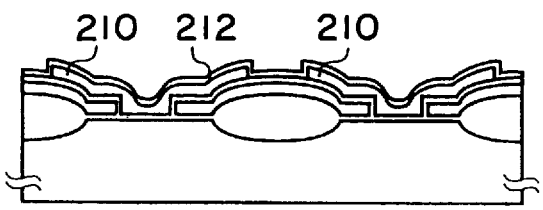
Figure 13J:
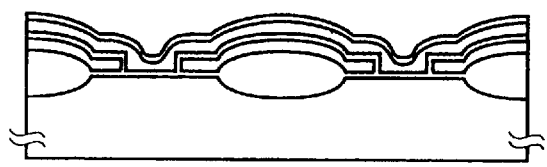

Next, an oxide layer 212 that is 20 nm thick is provided on polysilicon 510 in, e.g., the dry $O_2$ atmosphere at 800° C. both in the memory cell region and in the selection transistor region (FIG. 13JA and 13JB). Alternatively, a $SiO_2$—SiN—$SiO_2$ stacked layer, a so-called ONO layer having a thickness of approximately 20 nm may also be provided.

Figure 13K:
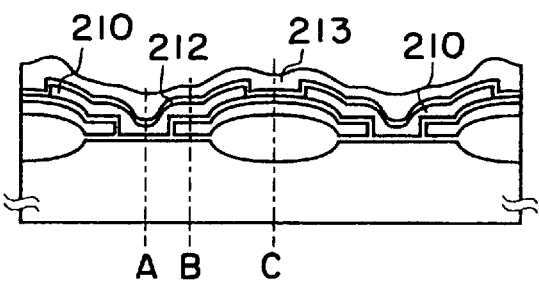
Figure 13K:
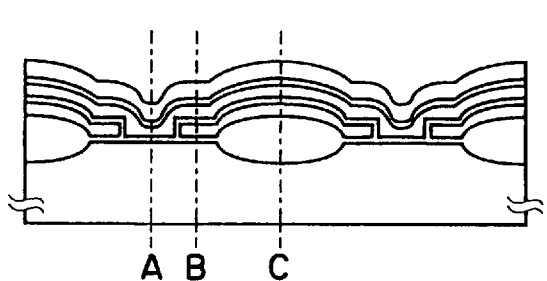

Subsequently, both in the memory cell region and in the selection transistor region, polysilicon 213 serving as a main control gate electrode is deposited up to, e.g., 400 nm by the LPCVD method (FIGS. 13KA and 13KB). At this time, for attaining a reduced resistance with respect to the polysilicon, P is diffused by annealing in, e.g., the POCl₃ atmosphere at 850° C., and thereafter a silicon oxide layer provided on the surface of the polysilicon is removed by NH₄F. If a low-resistance material is requested of the main control gate electrode, a metal silicide such as WSi may be formed on the polysilicon by the sputtering method or the LPCVD method etc.

FIGS. 13L–13N are sectional views taken substantially along the lines A, B, C and D in FIGS. 13KA and 13KB. Suffixes A, B, C and D correspond to sections along the lines A, B, C and D. Then, the steps which follow are explained in sequence.

Polysilicon 213 is selectively etched by use of the photolithography and the RIE (Reactive Ion Etching), and subsequently an oxide layer 212 and polysilicon 210 are etched in self-alignment, thereby forming a main control gate electrode 214 and a floating gate electrode 215 (FIGS. 13MA–13MD). With respect to the selection transistor in section D, gate electrodes 214', 215' are, though not illustrated, connected by an Al wire etc and become gate electrodes of the selection transistor.

Next, with the main control gate electrode 214, the floating gate electrode 215 and the gate electrodes 214', 215' of the selection transistor serving as a mask, P or As is implanted by the ion implantation method, thereby forming a source diffusion layer 216 and a drain diffusion layer 217. Next, a RIE damage is recovered, and P or As implanted is activated. For this purpose, an oxide layer 218 is formed in, e.g., the dry $O_2$ atmosphere at 800° C. (FIGS. 13NA–13ND).

From this process onwards, by the typical LSI manufacturing technique, a BPSG layer 219 is deposited and flattened, contact holes 220 are formed on the main control gate electrode 214, the sub control gate electrode 215, the gate electrodes 214', 215' of the selection transistor and the source diffusion layer 216 and the drain diffusion layer 217 of the NAND cell, the Al wiring layer 221 is then formed, the passivation layer 222 is composed of, e.g., a SiN/SiO$_2$ stacked layer by the plasma CVD method, and finally the pad is formed with the hole (FIG. 12A).

The NAND type EEPROM in the non-volatile semiconductor memory device in accordance with the second embodiment of the present invention is actualized by the steps described above. In the case of actualizing the LSI by arraying the memory cells in matrix, however, a plane structure as shown in FIG. 11B is taken. Herein, the sub control gate electrode 206 transverses a common source line 223, and hence it is required that As be previously ion-implanted before depositing the polysilicon 204, and that an embedded source line be thus formed.

The second embodiment of the present invention can be also be applied to the NOR type and NAND type memory cells as in the first embodiment, and the bias conditions when in the respective processes are, as in the first embodiment, shown in Tables 1 and 2.

Moreover, in the second embodiment, the sub control gate electrode extends toward the channel from the device isolation region, and therefore it never happens the edge of the device isolation region is contrived to function as a part of the tunnel oxide layer. Namely, there is no passage of the electrons when in the writing and erasing processes at the thinned region of the tunnel oxide layer at the edge of the device isolation region, and it is therefore feasible to provide the memory cell exhibiting a high reliability and less deterioration of the tunnel oxide layer if the number of writing and erasing processes increases.

The first and second embodiments have been discussed in detail so far. The present invention is not, however, limited to the embodiments given above but is applicable in many variations without deviating from the gist of the invention.

For instance, the thicknesses of the floating gate electrode, the control gate electrode and the sub control gate electrode are not confined to those shown in the embodiments discussed above but may be set properly. Further, the tunnel oxide layer is not also limited to 10 nm but may be thinned as much as the reliability permits as well as being thickened as much as the writing/erasing characteristics permit. Moreover, the tunnel oxide layer is not confined to SiO$_2$ but may be a nitride oxide layer such as an oxinitride layer. Further, a variety of oxide layers are formed in the dry O$_2$ atmosphere, however, the present invention is not limited to this. For example, wet oxidation, nitride diluting oxidation, hydrochloric acid added oxidation may also be effected, and any oxidizing temperatures may be available as far as a desired layer thickness and quality might be obtained. Further, layers such as a CVD oxide layer may also be available. Moreover, the polysilicon on the channel region is processed in combination of the photolithography with the RIE in the embodiments discussed above. If a more minute gap is demanded, however, a side wall is formed in combination of the formation of the CVD layer, the photolithography and etch-back using the RIE, and thereafter the polysilicon is etched, whereby much finer processing can be done.

Figure 14:
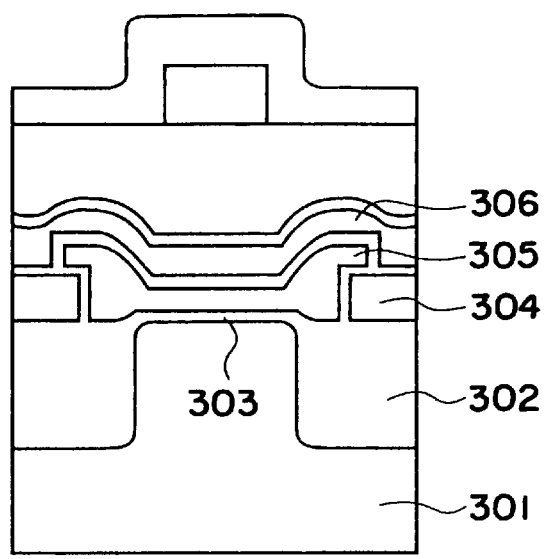
FIG. 14 is a sectional view showing a structure of a trench isolation type non-volatile semiconductor memory device in the first embodiment of the present invention.
Figure 15:
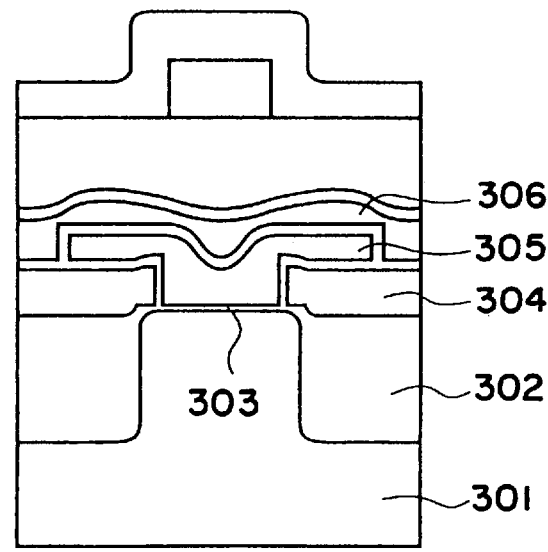
FIG. 15 is a diagram showing a structure of the trench isolation type non-volatile semiconductor memory device in the second embodiment of the present invention.

Further, the present invention is applicable to the memory cell using trench isolation. FIG. 14 illustrates a structure of the memory cell of a trench isolation type in the first embodiment of the present invention. FIG. 15 illustrates a structure of the memory cell of the trench isolation type in the second embodiment.

A trench isolation device isolation region 402 is provided on the semiconductor substrate 301, and, as in the case of using the LOCOS for the device isolation region, there are provided a tunnel oxide layer 303, a sub control gate electrode 304, a floating gate electrode 305 and a main control gate electrode 306. The bias conditions when in the respective processes of the memory cell become as shown in Tables 1 and 2.

In the memory cell of the trench isolation type in the second embodiment shown in FIG. 13, the tunnel oxide layer does not extend to the isolation edge, and consequently there is caused no concentration of the electric field when in the writing and erasing processes, whereby the reliability on the memory cell can be enhanced.

Further, the non-volatile semiconductor memory device of the present invention is structured so that a plurality of threshold values Vth of the memory cell are set and the device is capable of corresponding to a multi-value memory for storing the data corresponding to the Vth levels. Table 3 shows a relationship between the threshold value of the memory cell and an electric potential of each of the main an sub control gate electrodes when in the writing process when the present invention is applied to the multi-value memory. The voltage of the sub control gate electrode is set to 0V, whereby the writing to the memory cell is executed based on a low threshold value. The same voltage is set to VC, whereby the writing is done based on a high threshold value. Thus, the writing status can be set to the two values.

TABLE 3

| Control Gate Electrode Voltage Vcg1 | Sub Control Gate Electrode Voltage Vcg2 | Threshold Value of Memory Cell Vth |
| --- | --- | --- |
| Vpp | 0 | Vth: low |
| Vpp | Vcc | Vth: high |

TABLE 4

| ontrol Gate Electrode Voltage VCG1 | Sub Control Gate Electrode Voltage VCG2 | Sub Control Gate Electrode Voltage VCG3 | Threshold Value of Vth |
| --- | --- | --- | --- |
| Vpp | 0 | 0 | Vth: high |
| Vpp | Vcc | 0 | Vth: middle |
| Vpp | Vcc | Vcc | Vth: high |

Figure 16:
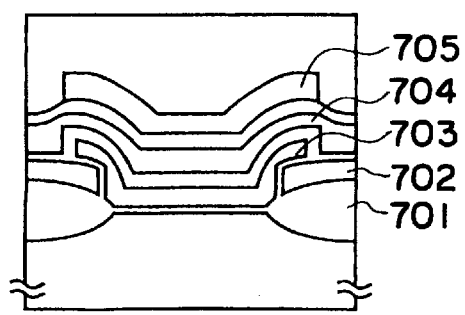
FIG. 16 is a diagram showing a structure of the non-volatile semiconductor memory device in a third embodiment of the present invention.

FIG. 16 shows an example where two sub control gates are provided. The device is constructed of a first sub control gate electrode 702 and a floating gate electrode 703 that are provided on a device isolation region 701, a main control gate electrode 704, and a second sub control gate electrode 705 provided on the main control gate electrode via an insulating layer. Table 4 shows a relationship between a threshold value of the memory cell and an electric potential of each of the main control gate electrode and the first and second sub control gate electrodes when in the writing process in the case of the above construction being applied to the multi-value memory. The writing to the memory cell is executed based on the low threshold value by setting to a 0V voltage of each of the first and second sub control gate electrodes, also executed based on a middle threshold value by setting to Vcc voltage of the first sub control gate electrode and to a 0V voltage of the second sub control gate electrode, and further executed based on a high threshold value by setting to a Vcc voltage of each of the first and second sub control gate electrodes. Thus, the writing status can be set to the three values.

When the structure of the memory cell according to the present invention is applied to the multi-value memory, the writing threshold multi-values Vth can be set by making variable the electric potential applied to the sub control gate electrode.

In the non-volatile semiconductor memory device in the first embodiment of the present invention, the applying electric potential when in the writing/erasing processes can be made smaller than in the prior art, and hence the peripheral circuit can be downsized. Moreover, if the power supply voltage is single, the internal step-up circuit can be also downsized, and the chip areal size becomes smaller than in the prior art.

Furthermore, in the non-volatile semiconductor memory device in the second embodiment of the present invention, in addition to the effects given in the first embodiment discussed above, it is feasible to restrain the tunnel oxide layer from being deteriorated enough to enhance the reliability by avoiding the writing and erasing processes from being executed at the area where the electric charges are easy to concentrate in the device for executing the FN tunnel writing and erasing processes.

Further, in a case where the non-volatile semiconductor memory device of the present invention is stored with the multi-value data, the complicated setting of the electric potentials is unnecessary with a decreased number of power supply voltages required for the writing process.

What is claimed is:

1. A non-volatile semiconductor memory device comprising:

a device isolation region selectively formed on a semiconductor substrate;

a region interposed between said device isolation regions;

a first gate electrode so selectively formed as to exist on at least said device isolation region;

a first gate insulating layer formed on a region interposed between said first gate electrodes;

a first insulating layer formed on said first gate electrode and on a side surface thereof;

a second gate electrode formed on said first insulating layer and on said first gate insulating layer, and so selectively formed that at least a part of said second gate electrode is overlapped with said first gate electrode;

a second insulating layer formed on said second gate electrode and on a side surface thereof;

a third gate electrode formed on said first and second gate electrodes via said first and second insulating layers; and drain and source diffusion layered regions formed on both sides of said second gate electrode in said region interposed between said device isolation regions.

2. The non-volatile semiconductor memory device according to claims 1, wherein in case of injecting the electric charges into said second gate electrode, a main writing gate voltage is applied to said third gate electrode, a sub writing gate voltage is applied to said first gate electrode, a writing drain voltage is applied to said drain diffusion layer, and said source diffusion layer is set to an earth electric potential, thereby implanting channel hot electrons.

3. The non-volatile semiconductor memory device according to claims 1, wherein said first gate insulating layer is a tunnel insulating layer for releasing the electric charges between said semiconductor substrate and said second gate electrode.

4. The non-volatile semiconductor memory device according to claims 1, wherein when the electric charges are released from said second gate electrode, said third gate electrode and said first gate electrode are set to the earth electric potential, and an erasing voltage is applied to said source diffusion layer or said semiconductor substrate, thereby executing Fowler-Noldheim erasion.

5. The non-volatile semiconductor memory device according to claim 1, wherein when the electric charges are injected into said second gate electrode, a main erasing gate voltage is applied to said third gate electrode, a sub writing gate voltage is applied to said first gate electrode, and said drain diffusion layer is set to the earth electric potential, thereby executing Fowler-Noldheim writing.

6. A non-volatile semiconductor memory device comprising:

a device isolation region selectively formed on a semiconductor substrate;

a region interposed between said device isolation regions;

a first gate electrode selectively formed so that said first gate electrode exists on at least said device isolation region, and that an edge portion thereof exists on said device isolation region;

a first gate insulating layer formed on a region interposed between said first gate electrodes;

a first insulating layer formed on said first gate electrode and on a side surface thereof;

a second gate electrode formed on said first gate insulating layer and on said first insulating layer, and so selectively formed that at least a part of said second gate electrode is overlapped with said first gate electrode;

a second insulating layer formed on said second gate electrode and on a side surface thereof;

a third gate electrode formed on said first and second gate electrodes via said first and second insulating layers; and drain and source diffusion layered regions formed on both sides of said second gate electrode in said region interposed between said device isolation regions, wherein memory data thereof indicates "0" or "1" depending on whether or not electric charges are injected into said second gate electrode.

7. A non-volatile semiconductor memory device comprising:

a device isolation region selectively formed on a semiconductor substrate;

a region interposed between said device isolation regions;

a first gate electrode selectively formed so that said first gate electrode exists on at least said device isolation region, and that an edge portion thereof exists on said region interposed between said device isolation regions;

a first gate insulating layer formed on a region interposed between said first gate electrodes;

a first insulating layer formed on said first gate electrode and on a side surface thereof;

a second gate electrode formed on said first gate insulating layer and on said first insulating layer, and so selectively formed that at least a part of said second gate electrode is overlapped with said first gate electrode;

a second insulating layer formed on said second gate electrode and on a side surface thereof;

a third gate electrode formed on said first and second gate electrodes via said first and second insulating layers; and drain and source diffusion layered regions formed on both sides of said second gate electrode in said region interposed between said device isolation regions, wherein memory data thereof indicates "0" or "1" depending on whether or not electric charges are injected into said second gate electrode.

8. The non-volatile semiconductor memory device according to claim 7, wherein a second gate insulating layer thicker than said first gate oxide layer in terms of an equivalent dielectric constant of a silicon oxide layer, is provided between said first gate insulating layer and said device isolation region.

9. A non-volatile semiconductor memory device comprising:
- a plurality of memory cells connected in series, said memory cell including:
  - a device isolation region selectively formed on a semiconductor substrate;
  - a region interposed between said device isolation regions;
  - a first gate electrode so selectively formed as to exist on at least said device isolation region;
  - a first gate insulating layer formed on a region interposed between said first gate electrodes;
  - a first insulating layer formed on said first gate electrode and on a side surface thereof;
  - a second gate electrode formed on said first gate insulating layer and on said first insulating layer, and so selectively formed that at least a part of said second gate electrode is overlapped with said first gate electrode;
  - a second insulating layer formed on said second gate electrode and on a side surface thereof;
  - a third gate electrode formed on said first and second gate electrodes via said first and second insulating layers; and
  - drain and source diffusion layered regions formed on both sides of said second gate electrode in said region interposed between said device isolation regions.

10. The non-volatile semiconductor memory device according to claim 9, wherein said first gate electrode includes a second gate insulating layer having its edge portion existing on said region interposed between said device isolation regions, formed between said device isolation region and said first gate insulating layer, and thicker than said first gate insulating layer in terms of an equivalent dielectric constant of a silicon oxide layer.

11. The non-volatile semiconductor memory device according to claims 9, wherein selection transistors are disposed on both sides of each of said plurality of memory cells connected in series, and a drain diffusion layer of said one selection transistor, a source diffusion layer of said other selection transistor, a gate electrode of each of said selection transistors, said first gate electrode of said memory cell, and said third gate electrode of said memory cell, are respectively connected a metal wiring layer via contact holes.

12. The non-volatile semiconductor memory device according to claims 9, wherein when the electric charges are released from said second gate electrode, said third gate electrode and said first control gate electrode are set to the earth electric potential, and an erasing voltage is applied to said semiconductor substrate, thereby executing Fowler-Noldheim erasion.

13. The non-volatile semiconductor memory device according to claim 9, wherein when the electric charges are injected into said second gate electrode, a main erasing gate voltage is applied to said third gate electrode, a sub writing gate voltage is applied to said first gate electrode, such a gate voltage as to switch ON said selection transistor to which said metal wiring layer is connected is applied to said drain diffusion layer, and said drain diffusion layer of said selection transistor to which said metal wiring layer is connected and said semiconductor substrate are set to an earth electric potential, thereby executing Fowler-Noldheim writing.

* * * * *

UNITED STATES PATENT AND TRADEMARK OFFICE
CERTIFICATE OF CORRECTION

PATENT NO.: 5,959,888
DATED: September 28, 1999
INVENTORS: Hitoshi ARAKI et al.

It is certified that an error appears in the above-identified patent and that said Letters Patent is hereby corrected as shown below:

Claim 2, Column 15, line 53, "claims 1" should read --claim 1--.

Claim 3, Column 15, line 62, "claims 1" should read --claim 1--.

Claim 4, Column 15, line 67, "claims 1" should read --claim 1--

Claim 8, Column 17, line 9, "oxide" should read --insulating--.

Claim 11, Column 18, line 10, "claims 9" should read --claim 9--.

Claim 12, Column 18, line 20, "claims 9" should read --claim 9--.

Signed and Sealed this

Eleventh Day of July, 2000

Attest:

Q. TODD DICKINSON

Attesting Officer

Director of Patents and Trademarks